(12) United States Patent
Biglieri et al.

(10) Patent No.: US 6,586,934 B2
(45) Date of Patent: Jul. 1, 2003

(54) METHOD AND APPARATUS FOR NUCLEAR MAGNETIC RESONANCE IMAGING

(75) Inventors: Eugenio Biglieri, Masio (IT); Marino Palazzolo, Genoa (IT); Luigi Satragno, Genoa (IT)

(73) Assignee: Esaote S.p.A., Casale Monferrato (IT)

( * ) Notice: Subject to any disclaimer, the term of this patent is extended or adjusted under 35 U.S.C. 154(b) by 0 days.

(21) Appl. No.: 09/835,403

(22) Filed: Apr. 17, 2001

(65) Prior Publication Data

US 2002/0011844 A1 Jan. 31, 2002

(30) Foreign Application Priority Data

Apr. 17, 2000 (IT) .......................... SV20A0017

(51) Int. Cl.[7] ................................. G01V 3/00
(52) U.S. Cl. ........................ 324/309; 324/307
(58) Field of Search ................ 324/307, 309, 324/306, 300, 318, 319; 128/653.5

(56) References Cited

U.S. PATENT DOCUMENTS 5,689,190 A * 11/1997 Cuppen ................ 324/319

6,043,654 A * 3/2000 Liu et al. ............... 324/309

FOREIGN PATENT DOCUMENTS

| EP | 0 430 322 | 6/1991 | |
|----|-----------|--------|----|
| EP | 0 654 675 | 5/1995 | |
| EP | 0654675 | * 5/1995 | ........... G01R/33/28 |

* cited by examiner

Primary Examiner—Edward Lefkowitz
Assistant Examiner—Brij B. Shrivastav
(74) Attorney, Agent, or Firm—Burns, Doane, Swecker & Mathis, L.L.P.

(57) ABSTRACT

A method of Nuclear Magnetic Resonance imaging includes the formation of a panoramic image or an image of a wide region of the body under examination, by obtaining a certain number of images (I, I', I", I''') from several limited regions of the body under examination (C) and by combining said images in a panoramic image (P). The individual images (I, I', I", I''') are obtained by moving the body under examination (C) in a certain direction and to a predetermined extent relative to the magnetic structure (1) and/or to the imaging volume (1) generated thereby.

The invention also relates to an apparatus for implementing said method.

60 Claims, 9 Drawing Sheets

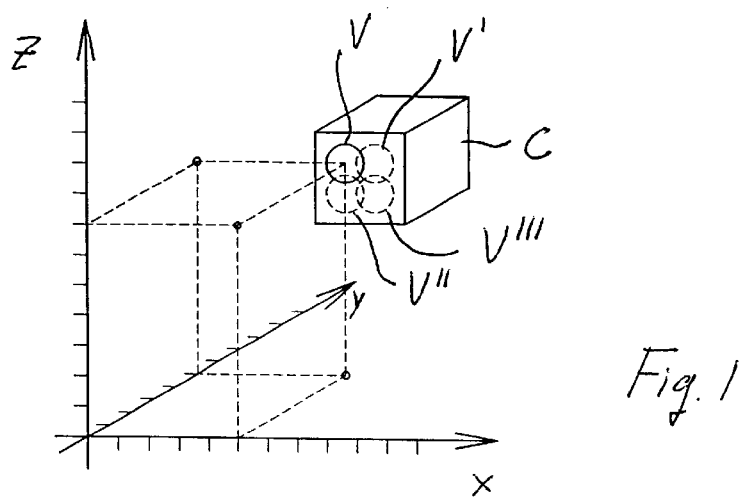
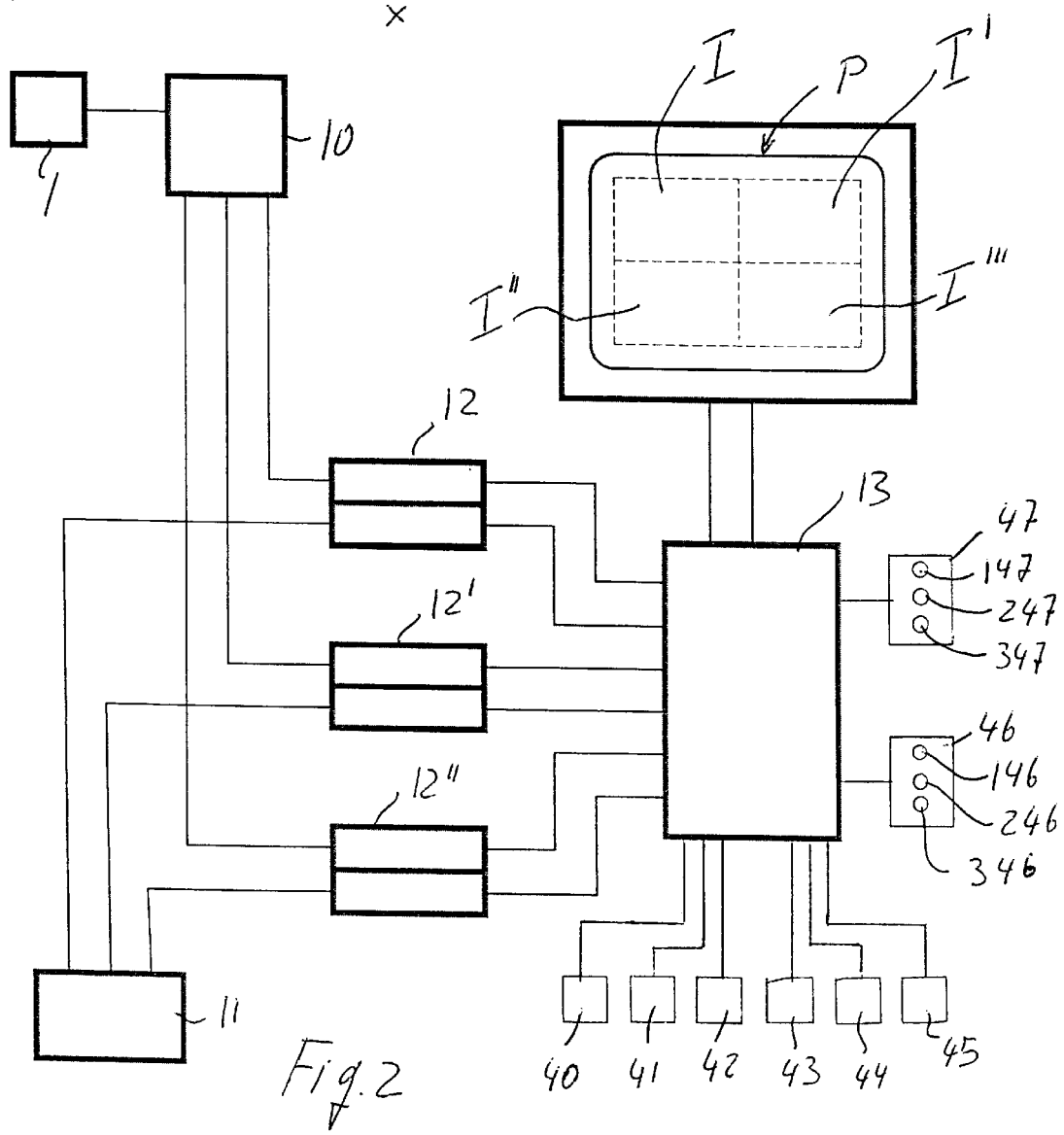
Fig. 1
Fig. 2

METHOD AND APPARATUS FOR NUCLEAR MAGNETIC RESONANCE IMAGING

This application claims priority under 35 U.S.C. §§119 and/or 365 to SV2000A000017 filed in Italy on Apr. 17, 2000; the entire content of which is hereby incorporated by reference.

BACKGROUND OF THE APPLICATION

1. Field of the Invention

The invention relates to a method of Nuclear Magnetic Resonance imaging, which method includes the following steps:

a) generating a static magnetic field having appropriate intensity and homogeneity characteristics in a predetermined imaging volume;

b) introducing a body or a part of said body in said imaging volume for examination;

c) generating magnetic field gradients in several different spatial directions to select the scan slice of the body under examination and to univocally phase-encode nuclear spins in the selected slice;

d) generating sequences of electromagnetic signals to excite the nuclear spins of the body or of the body part introduced in the imaging volume;

e) receiving the resonance signals emitted by nuclear spins and processing them to extract information therefrom and reconstruct the corresponding images which images relates only to a predetermined limited region of the body or of a part thereof to be examined;

f) displacing the body or the part thereof to be examined to a predetermined extent from said first imaging position to at least a second imaging position, the above steps being repeated for further regions of the body part under examination corresponding to further relative positions between the body or part thereof and the imaging volume, by displacing the body or the part thereof in predetermined directions relative to the imaging volume or vice versa.

2. Discussion of Related Arts

These methods are currently well-known and widely used. In most prior art systems imaging volumes are generated, i.e. regions of space permeated by a static magnetic field with the characteristics required for proper imaging, particularly intended for diagnostic purposes. This is aimed at obtaining considerably large imaging volumes, to allow imaging of relatively wide regions of the body under examination, particularly to find the region of the body part which is relevant for diagnostic purposes. The provision of these comparatively large imaging volumes requires apparatuses having large-sized magnetic structures. In addition to their high purchase cost, these apparatuses are expensive to install and need to be located in appropriate facilities.

EP 654 675 discloses an apparatus having a simplified "total body" construction for Nuclear Magnetic Resonance tomography. According to this document, a magnetic field is generated for Nuclear Magnetic Resonance imaging, which permeates a substantially cylindrical volume whose axial dimension equals from 10 to 15 cm. The body under examination is displaced in the direction of the cylindrical body axis, to allow imaging of successive slices in different regions of the body. The processed images or received signals are stored sequentially and in relation to the scan slice of the body wherefrom they were generated to provide a virtual three-dimensional image in the memory. In order to limit scanning time, particular and relatively fast sequences are used, such as those named echo-planar sequences. During the scanning operation, the information relating to the whole scanning cross section of the body is detected, processed and stored. Once the data obtained by scanning the successive slices are stored, they may be recalled and displayed. The construction of the apparatus derives from that of the so-called total-body apparatuses and, with respect to the latter, the ring-like magnetic structure is only axially shortened depending on whether the volume permeated by the imaging static field is selected as being an axially short cylinder or a thin disk.

EP 430 222 discloses a method for Nuclear Magnetic Resonance tomography imaging of the same type as radiological scanograms. Here again the magnetic structure derives from "total body" constructions, i.e. those designed for imaging the whole body or a considerable part thereof. The method disclosed in this document equally provides that a succession of different slices of the body under examination are scanned, by displacing the body under examination relative to the useful volume permeated by the static magnetic field. However, unlike the method of EP 654 675, this method provides the selection of a slice plane parallel to the longitudinal extension of the body under examination and parallel to the displacement direction of said body, by applying dephasing sequences, e.g. for saturating the nuclear spins of each cross section beyond the slice oriented in the direction of advance of the body, to limit the detection of echo signals to those actually emitted by the spins of the slice and/or section of the body oriented in the displacement direction. Here again the images are processed and generated at the end of the whole scanning process.

Hence, according to both prior art methods, images are displayed after the whole body or region of interest thereof have been scanned.

Now apparatuses are known, in which the magnetic structure is drastically limited in size, with a consequent reduction of the volume in which the magnetic field has the characteristics required for proper imaging. These apparatuses provide considerable advantages in terms of money savings, but do not allow to obtain relatively wide images of the relevant region, or not at a high quality level.

Moreover, in these apparatuses the problem exists of finding the region of the body which is of relevance or of diagnostic interest. Hence, repeated scanning operations of different regions of a body part are required to frame the region of diagnostic interest. For instance, for a diagnosis on a meniscus, several different scans of the knee may be required to obtain the proper, best shot of the meniscus region.

These scans are currently made with sequences adapted to provide the best image in terms of definition and contrast, but these sequences are comparatively long and complex, so much longer scanning times are requested. Even in total body apparatuses, or the like, in which the structure allows for relatively wide imaging volumes, the sequences are adapted to ensure the best image quality, resulting in a long scanning and processing time.

Moreover, even in the so-called "total body" apparatuses, the quality of the image might not be consistent all over the volume and anyway imaging time tends to be comparatively long when obtaining wide images.

Imaging sequences for generating high quality images, besides being time-consuming, also involve considerable costs as regards the construction of the apparatus, which has to be configured to execute them within acceptable times.

Prior art apparatuses have such characteristics that they do not allow a real time, or almost real time display of the detected images, moment by moment, e.g. while the body under examination is displaced. This is a drawback when imaging is performed in transient conditions of the body under examination, which may be either pathologic or physiologic or induced by relatively invasive techniques, such as the use of substances, injected into the body under examination, designed to improve the signals received from the body under examination or parts thereof, such as contrast agents for Nuclear Magnetic Resonance.

OBJECTS AND SUMMARY

The invention is based on the acknowledgement that, in practice, no excessively wide image of the body, limb, or region thereof is required for the purpose of finding the specific shot for diagnosis or for a specific examination and for finding the right acquisition moment with reference to induced transient conditions. Images of wide portions of the body, the so-called panoramic images are used to provide an overall view of the situation. Certain "total body" apparatuses use sequences which allow almost real time imaging upon introduction of the patient in the imaging cavity, i.e. as the patient gradually enters the magnet cavity. These techniques are highly complex and require heavy and fast processing, which may be only performed in advanced and costly hardware structures, contained both in the NMR apparatus and in the processing unit.

The invention has an object of providing a method for Nuclear Magnetic Resonance imaging as described hereinbefore, which allows fast and easy location of the best shot of the relevant regions of the body, while providing both high quality images of very restricted regions of interest and panoramic images of portions of the body to be inspected, for example, for said regions of interest, the whole with relatively simple and inexpensive means, as compared with current costs of Nuclear Magnetic Resonance apparatuses, and regardless of the type and size or purpose of the apparatus.

The invention achieves the above purposes by providing a method as described above, in which:

h) the useful imaging volume permeated by the magnetic field, having sufficient characteristics to ensure proper Nuclear Magnetic Resonance imaging, is limited in all spatial directions with reference to the volume of the body under examination or part thereof, the body under examination being displaced relative to said volume in the three spatial directions.

By this arrangement, even without editing the scanning sequences, the reduction of the useful imaging volume limits the amount of information to be processed thereby reducing processing and displaying times.

In accordance with an additional characteristic, the reduction of the useful volume and/or the choice of the definition, i.e. the number of lines or pixels to be processed for image display and/or the characteristics of the scanning sequences which determine the signal-to-noise ratio and/or contrast are set separately or in combination in such a manner as to limit detection and/or processing and/or display times for each image to such an extent as to obtain total detection, processing and display times for the scanned image below one second, preferably a fraction of a second.

In this manner, the scanned image may be displayed with an acceptable delay, with respect to the moment in which the new relative position between the imaging volume and the body under examination is reached.

Typically, a total time for the steps of exciting echo signals, receiving and processing and reconstructing, as well as displaying the image of about 1/10 of a second to a second allows to display the different images showing the different displacement conditions, by using standard sequences, not heavy as regards hardware equipment and construction. Therefore, unlike prior art methods, particularly those disclosed in the above documents, any displacement of the body under examination causes an immediate or substantially immediate display of the relevant scanned image.

With reference to an additional characteristic of the method according to this invention, there is particularly provided the possibility to reduce, by saturation or dephasing sequences, the imaging volume, i.e. the so-called FOV (Field of View), as compared with the largest size thereof provided by the magnet structure. Such reduction may be calibrated with respect to the size of the particular region of interest of the body under examination.

Hence, for instance, for a diagnostic examination on the vertebral column or, for instance, of a meniscus, the imaging volume, i.e. the Field of View may be reduced to a size which is slightly larger or smaller than the region of particular interest of the body under examination.

Typically, in an examination of the vertebral column or the meniscus, the FOV might be reduced to a few centimeters, typically to a sphere or a disk having a diameter of a few centimeters, particularly of about 5 cm. In addition to the reduction of the signal to be processed, hence of the total imaging times from excitation of the matter to image display, the advantage is provided that said reduction allows to operate in the central portion of the imaging volume, farther from the periphery of the magnetic structure, in which the magnetic field is distorted in such a manner as to cause image quality losses.

Moreover, it has to be noted that, while a drastic reduction of the total imaging time is achieved with an equal resolution, i.e. equal number of lines or pixels, the drastic reduction of the FOV allows to increase resolution and to keep such total time at the same level as an imaging process with a larger FOV and a lower resolution.

An additional characteristic of the method of the invention allows real time editing of the imaging sequence/s, with reference to the type of said sequences, to the variation of the field of view (FOV) and/or to their duration and/or to additional parameters to effect a change aimed either at reducing or at improving image quality, with reference to definition and/or to signal-to-noise ratio and/or to contrast and/or to the presence of artifacts and to immediately display the image obtained thereby with the new features. In this case, for instance during body displacement and fast scanning of images for the different positions therefore, and immediate display of said images, the user may stop the relative displacement of the body under examination or of the magnetic structure and perform higher quality imaging on the set position to verify if the region whereof the image has been scanned is already the one of interest or relevance for the examination. If this is not the case, the user may restore the starting conditions and continue the examination with the relative displacement between the body under examination and the magnetic structure.

Alternatively, the total imaging time from echo excitation to image display may be modified to take advantage of higher or lower frame rates, i.e. the speed at which the individual images of the different slices are displayed. This is advantageous in that, in regions of the body under examination that are far or assumed to be far from the region of interest, the quality of the image may be limited to increase the display speed, i.e. to reduce the imaging time from echo excitation to image display in the region of lower or poorer interest, whereas imaging times may be extended in the regions of higher interest, while keeping constant or substantially constant total examination times, though obtaining images with a better quality for the regions of higher interest of the body under examination.

Particularly, in combination with typical magnetic structures of the so-called dedicated apparatuses, i.e. having cavities of the magnetic structure for housing only a portion of the body under examination and especially with C-shaped magnetic structure, there may be provided an optical visual indication of the slice whereto the image pertains, which may be based either on the specific morphology of the displayed regions of the body under examination or on optical indicators or pointers directed on the body under examination. The method of the invention also includes the steps of univocally defining the relative position between the body or part thereof and the imaging volume whereto each detected image pertains, while the parameters of this displacement, i.e. essentially the direction and magnitude of the displacement vector are stored in relation to the data of the corresponding scanned images. Hence, during the examination, i.e. when the successive images of the different regions of the body are scanned, a virtual three-dimensional image may be generated, stored and recalled, to allow a future reconstruction or display of the images of the different slices, or o a three-dimensional image.

According to an improvement, the individual images of the predetermined regions of the body under examination or of the part thereof are obtained with scanning sequences intended to provide low definition images.

As previously stated, once a predetermined shot, or the proper desired shot of the region of interest of the body or body part has been defined, the method of the invention provides the possibility to perform acquisition scanning with sequences intended to provide alternatively and/or in combination a higher definition and/or a higher contrast and/or a better signal-to-noise ratio.

Besides the possibility to edit scanning sequences and modes for signal processing, transformation into images and filtering said images, each of the image characteristics which are to be adjusted, i.e. particularly definition, contrast and signal-to-noise ratio may be adjusted separately.

The invention advantageously provides a separate control for the characteristics of the acquisition sequences and/or of the processing modes and/or of image filters with reference to the effect on images particularly as regards definition, contrast and signal-to-noise ratio. The control for adjusting image quality in terms of definition and/or contrast and/or signal-to-noise ratio may operate in a continuous or step-like manner, as determined by the continuous or discrete variability of the parameters of sequences and of processing software or by their consisting of additional sequence or processing steps or of a combination of sequences or processing procedures or of repeated sequences or processing procedures.

In one embodiment, there may be provided a certain number of stored basic scanning sequences and/or image processing procedures, which may be combined with each other, the control for adjusting image definition and/or contrast and/or signal-to-noise ratio characteristics consisting of controls for selecting and/or combining said sequences and/or said processing procedures. There may be also provided predetermined combinations of basic sequences or basic procedures, which are related to a change of definition and/or contrast and/or signal-to-noise ratio, the corresponding change controls simply consisting of selections between predetermined and preset combinations. In this case, each combination provided is associated to an indication for the user, which does not define the combination of sequences or processing procedures, but the related level of definition and/or contrast and/or signal-to-noise ratio.

In accordance with an additional characteristic of the invention, the different shots of partial regions of the body or of the body part under examination, which are imaged in the same slice plane, but in regions other than the slice of the body under examination and related to their relative position between the body or body part and the imaging volume, may be combined together to form a panoramic image composed of the individual partial images of the body or of the part thereof.

In this case, low definition, low contrast and low signal-to-noise ratio panoramic images may be obtained, hence low or medium quality panoramic images. It is also possible to obtain high quality panoramic images, separately and/or in combination, in terms of definition, contrast and signal-to-noise ratio, the user being allowed the possibility to operate on the characteristics of imaging sequences and/or on image processing and/or filtering modes in such a manner as to change, separately or in combination, definition and/or contrast and/or signal-to-noise ratio.

Hybrid panoramic images may be also obtained, i.e. composed of partial shots, each having at least partly an inconsistent image quality, particularly in terms of definition and/or contrast and/or signal-to-noise ratio. The relative displacement of the body or a part thereof and of the imaging volume may also follow one, two or all three spatial coordinates.

This displacement may account for the size and morphology of the predetermined limited region whereof imaging is performed, so as to obtain images of limited regions whose boundaries are substantially coincident, slightly overlapping or spaced from each other.

Different extensions, i.e. different Fields of View (FOV) might as well be provided for each limited area, depending on the relevant anatomic detail.

Particularly, when obtaining panoramic images in which the element of interest is a portion of the panoramic image composed of individual images of adjacent or contiguous limited regions, peripheral regions may be imaged with reference to larger predetermined limited regions as compared with the predetermined limited regions containing the elements of interest, whereby there may be provided partial shots or partial images having different width (FOVs) or displaying partial regions of the body or of a part thereof having different widths.

Particularly, when Nuclear Magnetic Resonance images of the individual limited regions are sectional images of the body or of a part thereof, the above described technique not only provides two-dimensional panoramic images, but, like in three-dimensional graphics, the successive images of the limited regions may be related together to compose, combine or reconstruct even three-dimensional images of the region of interest and with more or less panoramic characteristics.

The displacement may be performed in steps of equal width or increasing or progressing according to a predetermined rule, said steps being for instance smaller in the region of highest interest of the part under examination and larger in the region of lowest interest. In this case, the individual images obtained will be images of partial regions which are closer to each other in the region of interest and reduce their nearness in the regions surrounding the region of interest or examination of the body or of the part thereof.

The advantages of method of the present invention are apparent from the above disclosure.

First, the method according to the invention allows to find the best shot for instance for the purpose of diagnosis, without requiring excessively long imaging times or heavy construction changes and integrations in the structure of the NMR apparatus and in the processing units. Conversely, the advantage that the shot of interest typically relates to a relatively small region of the body or of a part thereof might be used to restrict the construction size and complexity of the apparatus and to reduce the imaging volume, thereby reducing scanning and image processing times.

The image of the newly imaged slice may be displayed directly and in real time with a certain delay with respect to the displacement of the body under examination, whereby a direct visual control is possible both on the image displayed and on the morphological position in a certain portion of the scanned and displayed position.

The additional arrangement of allowing the independent user selection, either separately or in combination, of the adjustments in scanning sequences and in image processing procedures and the imaging process allows the user to obtain an image having the most appropriate quality for the purpose, for instance, of image evaluation.

Also, the method according to the invention allows the formation of Nuclear Magnetic Resonance panoramic images even when using dedicated apparatuses, or apparatuses with very small magnetic structures, which are intrinsically able to generate or ensure limited imaging volumes. This provides a considerable economic advantage in terms of purchase as well as installation costs and important advantages in terms of convenience and functionality of use of these apparatuses by users.

The method according to the invention provides advantages in apparatuses which allow the generation of relatively large imaging volumes and hence of relatively wide images. In fact, zoom techniques aimed at FOV reduction, thanks to which smaller images of regions of the body or of body parts may be obtained as compared with normal imaging conditions allow to limit scanning, processing and display times. A combination of zoom techniques with the method according to the invention allows, in this case, to obtain partial images consisting of combinations of images obtained with the zoom technique and showing adjacent regions of the body or of the body part, or three-dimensional images showing a region of the body or of the body part which is smaller than the one usually permeated by the imaging volume.

The above description also clearly shows the versatility of the method according to the present invention.

The invention also relates to an apparatus for Nuclear Magnetic Resonance imaging, which apparatus includes:

a) a magnetic structure for generating a static field in a predetermined volume inside an imaging cavity and with at least one opening to provide access to said imaging cavity;

b) at least one transmitting coil and at least one receiving coil;

c) at least one, preferably more gradient coils;

d) means for processing resonance signals to transform them into displayable image signals;

e) means for displaying image signals; The apparatus according to the invention additionally includes, to implement said method:

f) means for relative displacement of the body under examination and of the magnetic structure;

g) means for separate and alternative or combined adjustment, particularly of the Field of View—or FOV—size and/or of image definition and/or image contrast and/or signal-to-noise ratio.

The means for separate and alternative or combined adjustment, particularly of the Field of View (FOV) size and/or of image definition and/or image contrast and/or signal-to-noise ratio, are continuous selectors or step-operated selectors whereby the parameters relating to the type of scanning sequences and/or of image processing procedures or to the combination of scanning sequences and/or of image processing procedures are adjusted, with reference to the effect on definition, contrast and signal-to-noise ratio.

In this case, there may be provided memories for storage of several different basic scanning sequences and/or processing procedures or combinations thereof or several different predetermined scanning sequences and/or processing procedures and relating to different Fields of View and/or to definition and/or contrast and/or signal-to-noise ratio qualities, the controls being arranged to adjust the parameters for execution of the different basic scanning sequences or processing procedures and/or to generate combinations of different scanning sequences and/or different processing procedures or to select combinations of scanning sequences or processing procedures or particular scanning sequences or processing procedures, which are prefixed and associated to the different desired Field of View size and/or definition and/or contrast and/or signal-to-noise ratio variations. Advantageously, the invention provides means allowing the user to control and select the sequences and/or the combinations of sequences which are identified, rather than by the typology of the sequences or combination of sequences in use, by the effect thereof on the displayed image, and especially on contrast and/or definition and/or Field of View size and/or signal-to-noise ratio and/or repetition of frames, i.e. the so-called frame rate.

Hence, the user has control capabilities oriented on the result to be obtained, i.e. a more detailed image, an image having a larger or smaller Field of View, an image with a better contrast, etc., without having to deal with complex technical problems relating to the individual sequences and to the parameters thereof, which are beyond the specific skills of the user, especially in the diagnostic art.

In accordance with an additional characteristic, the apparatus further includes:

h) means for measuring displacement direction/s and distances;

i) means for relating resonance signals to the relevant parameters of relative positioning of the body under examination and of the magnetic structure;

j) means for storing the different images and their respective position parameters;

k) processing means for combining images;

The processing means may include means for recognition of overlapping areas of the individual images of the limited partial regions and for combination thereof into the overall image so that said overlapping areas can be properly positioned.

Moreover, there may be provided correction or approximation algorithms which correct the shared portions between images so that an overall image with no substantial deformation is obtained.

The means for relative displacement of the body and of the magnetic structure may be of any type and may allow displacement, along polar Cartesian coordinates or the like, depending on the geometry of the magnetic structure, on the imaging volume and/or on the body to be examined.

Advantageously, in combination with the magnetic structure, there are provided means for supporting the body under examination or a part thereof, which are movable relative to the magnetic structure through the different displacement areas.

Alternatively, said movable support means are associated or borne by the receiving coil.

Particularly, in small magnetic structures like those for the apparatuses dedicated to the examination of body parts, of limited anatomical regions or limbs, the invention provides that the receiving coil is integrated in the magnetic structure and is not, as conventionally provided, a removable element.

This characteristic provides considerable construction advantages, by avoiding the presence of movable i.e. displaceable supports, associated to the receiving coil. In this case, the body part may be simply held up by supports of the overhanging type, projecting in the cavity of the magnetic structure and separated therefrom, for instance extensions of patient supporting chairs, seats or tables.

This arrangement may be implemented without affecting image quality, in said apparatuses with small magnetic structures, thanks to the fact that the imaging cavity is smaller and that the walls thereof which support the receiving coil are sufficiently close to the body or to the body part under examination.

Visual means for indicating the slice being scanned may be also provided, such as light pointers directed towards the body under examination in a position coinciding with the selected scan slice.

The above description clearly shows the simplicity of implementation of the method according to the invention. The necessary construction arrangements are simple and inexpensive. Especially as regards processing, no considerable changes are required in hardware, with the only need to load data processing, correlation and combination software therein. The apparatus for implementing the method does not require high-cost processing equipment, neither for speed nor for performance since, by using Fields of View whose size is limited to the size of the detail of interest of the body under examination, the amount of information to be processed even when complex sequences are used to obtain high quality images is still relatively limited.

Further improvements of the invention will form the subject of the subclaims.

BRIEF DESCRIPTION OF THE DRAWINGS

The characteristics of the invention and the advantages derived therefrom will appear more clearly from the following description of a few non limiting embodiments, illustrated in the annexed drawings, in which:

FIG. 1 is a schematic view of an example of relative displacement of the imaging volume with respect to a body under examination.

FIG. 2 shows a simplified block diagram of the processing unit for the apparatus according to the invention.

DETAILED DESCRIPTION OF PREFERRED EMBODIMENTS

Figure 3:
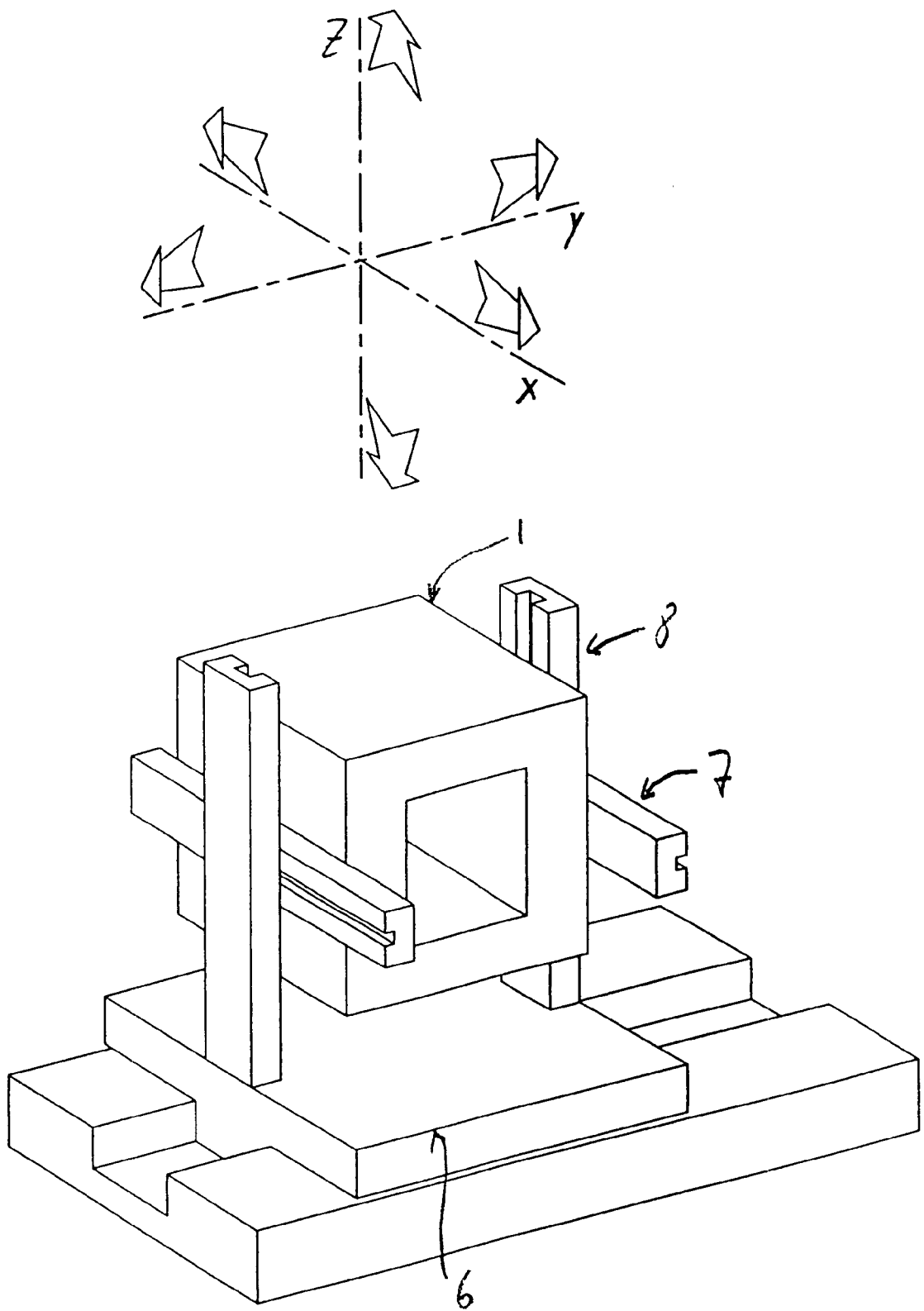
FIG. 3 is a schematic perspective view of a magnetic structure for Nuclear Magnetic Resonance imaging which may be displaced along three orthogonal Cartesian axes.
Figure 4:
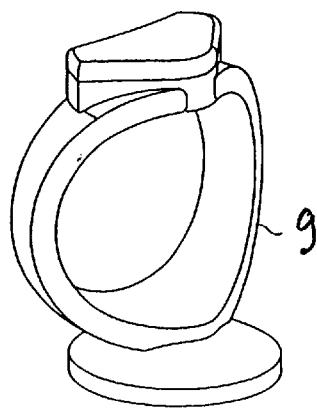
FIGS. 4 to 7 are different views of an annular or cylindrical receiving coil.
Figure 5:
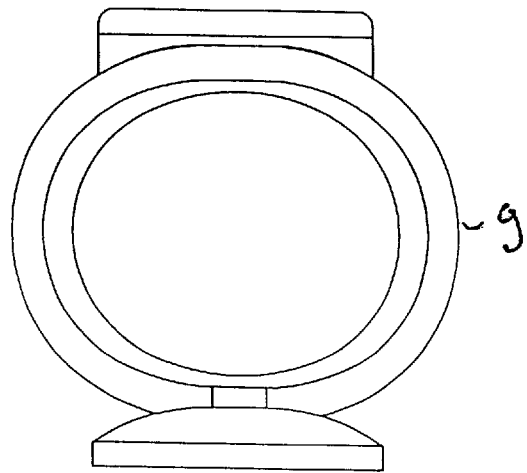
Figure 6:
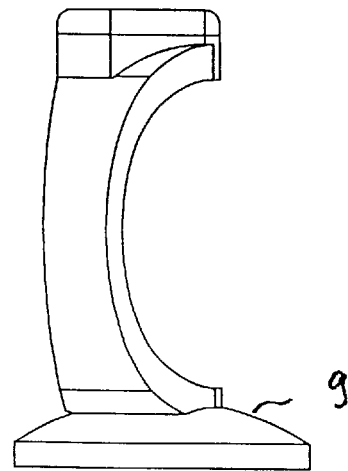
Figure 7:
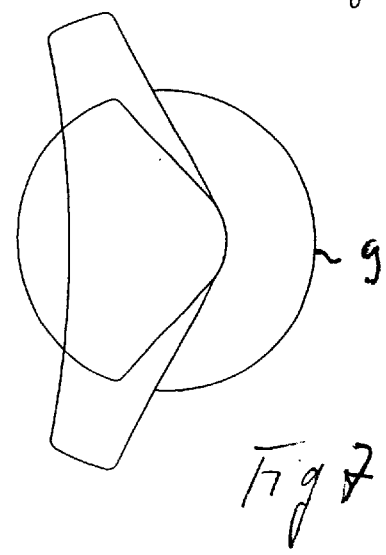

A Nuclear Magnetic Resonance imaging apparatus comprises a magnetic structure 1 having at least two opposite poles 2, 3, which define a cavity and between which a static magnetic field is generated in a predetermined imaging volume V of said cavity. The magnetic structure has gradient coils associated thereto, to generate magnetic field gradients for selecting the imaging slice and encoding the spins, as well as a coil for transmitting the excitation pulses and a receiving coil. These elements are well-known and present in all Nuclear Magnetic Resonance imaging apparatuses. The cavity may be accessed from one or more openings of the magnetic structure. In the embodiments illustrated herein, the magnetic structures have cavities which may be accessed from two opposite sides (FIGS. 3, 8, 14) or from three peripheral adjacent sides (FIG. 13), even though these embodiments are to be intended without limitation, the inventive principle being also applicable to magnetic structures only consisting of two plates forming two opposite poles and supported in a spaced position by one, two or more columns or posts or by overhanging supporting structures or to magnetic structures with other configurations.

The body under examination C, or a part thereof is inserted in the cavity with the region thereof to be examine passing through the imaging volume V. This situation is schematically shown in FIG. 1.

The method in accordance with the invention consists in imaging several successive regions of the body under examination by displacing the body under examination relative to the imaging volume V (and/or to the magnetic structure) so that the region of the body C under examination or of the part thereof, which is contained therein is different from the one imaged before. This displacement may be performed in different spatial directions. In the embodiment described herein, space is defined in Cartesian axes x, y, z and the body under examination may be displaced to a predetermined extent and along one, two or all three predetermined directions. The different imaged regions of the body are shown in FIG. 1 by the projection of the imaging volume on said body C and are denoted as V, V', V'', V'''.

Displacements may be performed even in accordance with schemes referred to other types of three-dimensional space-defining coordinates, such as angular coordinates, polar coordinates, etc. The choice of coordinates depends from time to time on actual conditions, such as the conformation of the magnetic structure and of the support means.

Each imaging operation on different regions of the body or of the body part under examination corresponds to an associated relative position of the body under examination and of the imaging volume V and/or of the magnetic structure.

In accordance with a first variant of the method, which is designed to perform a fast scan of several different regions of the body under examination C or of a part thereof, in order to find the most suitable relative position of the body under examination and of the imaging volume to produce the shot of the region of interest or relevance of the body C, for instance for diagnostic purposes, predetermined regions of the body under examination or of a part thereof are individually imaged though scanning sequences intended to provide low-definition images. Low-definition imaging allows to keep very short image acquisition and processing times, so that almost a real-time image may obtained of the different partial regions of the body C.

Once the proper shot of the region of interest of the body or body part has been defined, the method of the invention provides the possibility to perform acquisition scanning with sequences intended to provide alternatively and/or in combination a higher definition and/or a higher contrast and/or a better signal-to-noise ratio.

The method according to the invention also provides the possibility to edit scanning sequences and modes for signal processing, transformation into images and filtering separately with reference to the characteristics of the image which are to be adjusted, i.e. particularly separately with reference to definition, contrast and signal-to-noise ratio.

To this end, there is provided a separate control for the characteristics of the acquisition sequences and/or of the processing modes and/or of image filters with reference to the effect on images particularly as regards definition, contrast and signal-to-noise ratio.

The control for adjusting image quality in terms of definition and/or contrast and/or signal-to-noise ratio may operate in a continuous or step-like manner, as determined by the continuous or discrete variability of the parameters of sequences and of processing software or by their consisting of additional sequence or processing steps or of a combination of sequences or processing procedures or of repeated sequences or processing procedures.

In one embodiment, there may be provided a certain number of stored basic scanning sequences and/or image processing procedures, which may be combined with each other, the control for adjusting image definition and/or contrast and/or signal-to-noise ratio characteristics consisting of controls of combination of said sequences and/or of said processing procedures.

There may be also provided predetermined combinations of basic sequences or basic procedures, which are related to a change of definition and/or contrast and/or signal-to-noise ratio, the corresponding change controls simply consisting of selections between predetermined and preset combinations. In this case, each combination provided is associated to an indication for the user, which does not define the combination of sequences or processing procedures, but the related level of definition and/or contrast and/or signal-to-noise ratio.

In accordance with an additional characteristic of the invention, the different images displaying shots of partial regions of the body or of the body part being examined, in relation to their relative position of the body or body part and of the imaging volume, may be combined together to form a panoramic image composed of the individual partial images of the body or of the part thereof.

In this case, low definition, low contrast and low signal-to-noise ratio panoramic images may be obtained, hence low or medium quality panoramic images. According to an additional variant of the method, the partial images of the body C or of a part thereof may be acquired even with a higher definition, and/or a better contrast and/or a better signal-to-noise ratio. In this case, it is also possible to combine partial images into high quality panoramic images, independently and/or in combination in terms of definition, contrast and signal-to-noise ratio, the user being allowed the possibility to edit the characteristics of acquisition sequences and/or the image processing and/or filtering modes in such a manner as to adjust, separately or in combination, definition and/or contrast and/or signal-to-noise ratio. Hybrid panoramic images may be also obtained, i.e. composed of partial shots, each having at least partly an inconsistent image quality, particularly in terms of definition and/or contrast and/or signal-to-noise ratio. A particularity of the method of the invention consists in modifying the so-called FOV (Field of View), i.e. the useful size for imaging in a range between a minimum size and a maximum size, within the size of the imaging volume, i.e. of a volume included in the cavity of the magnetic structure in which the static field has such properties of homogeneity as to provide useful Nuclear Magnetic Resonance images.

Typically, for dedicated apparatuses, i.e. apparatuses whose magnetic structures have cavities designed to only house limited portions of a body under examination, this imaging volume, approximated by a sphere, has a diameter of about a few tenths of centimeters preferably of about 15 to 25 cm. Therefore, for each slice selected by the appropriate selection gradient, the so-called Field of View consists of a circle having a diameter of about 15 to 25 cm. The method of the invention provides that the Nuclear Magnetic Resonance image scanning sequences are edited in such a manner as to limit the Field of View to a partial portion of said Field of View, allowing a possibly progressive reduction thereof to very small values, e.g. of the order of a few centimeters, particularly of the order of about 5 cm.

Obviously, the size of the Field of View depends on the detail of the body under examination which is to be displayed. The limitation or variation of the Field of View to a smaller size may be obtained by means of well-known nuclear spin saturation or dephasing techniques in the regions of the body under examination outside the reduced Field of View. The size of the Field of View may be changed at will, by appropriately editing the nuclear spin saturation or dephasing sequences.

The reduction of the Field of View according to the invention allows, at the same definition, to drastically limit the amount of information to be processed and so, at the same image quality (particularly at the same definition) to speed up processing of received signals, and image generation therefrom, as compared with imaging processes with larger Fields of View.

It is further possible to keep constant acquisition and displaying times, by setting a smaller Field of View and by increasing definition. In this case, at the same acquisition and processing times, more defined images are obtained.

This reduction of the Field of View, in combination with the relative displacement between the body under examination and the magnetic structure allows to generate successions of slice images in different locations of the body under examination and in different regions of the body under examination along the same slice plane.

The method of the invention allows to acquire images of the body under examination and display them at such a speed that each different image of the slice of the body under examination after a relative displacement between the body under examination may be displayed with a very limited delay with respect to the body displacement action. Therefore, the user may displace the body under examination relative to the magnetic structure, manually or by using actuator means, and see almost simultaneously the image showing the new position. This feature is considerably improved by reducing the Field of View to the size of the detail/s of the body under examination which is/are of real interest to the user.

Figure 15:
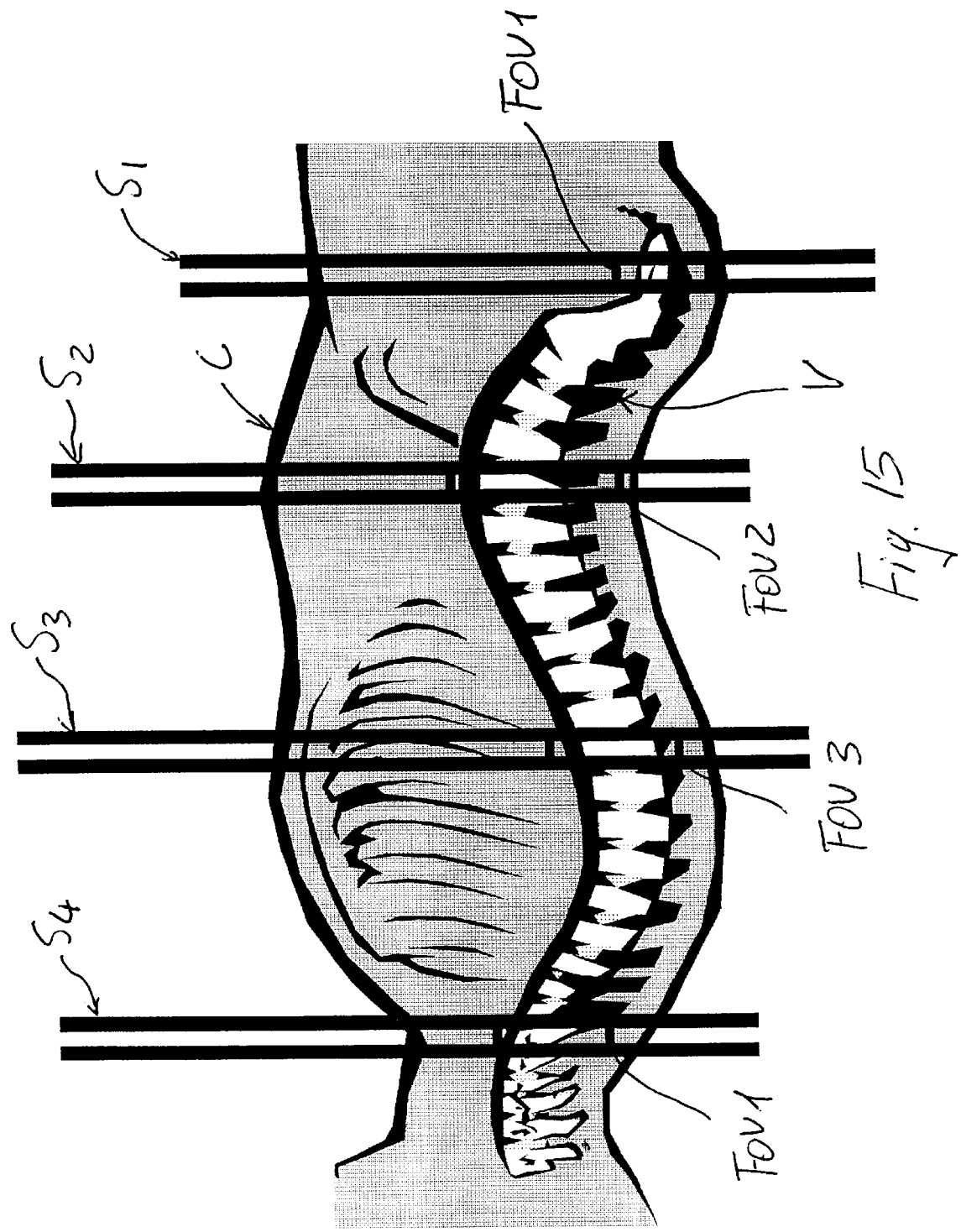
FIGS. 15 and 16 are schematic side and front views of scanning method types.
Figure 16:
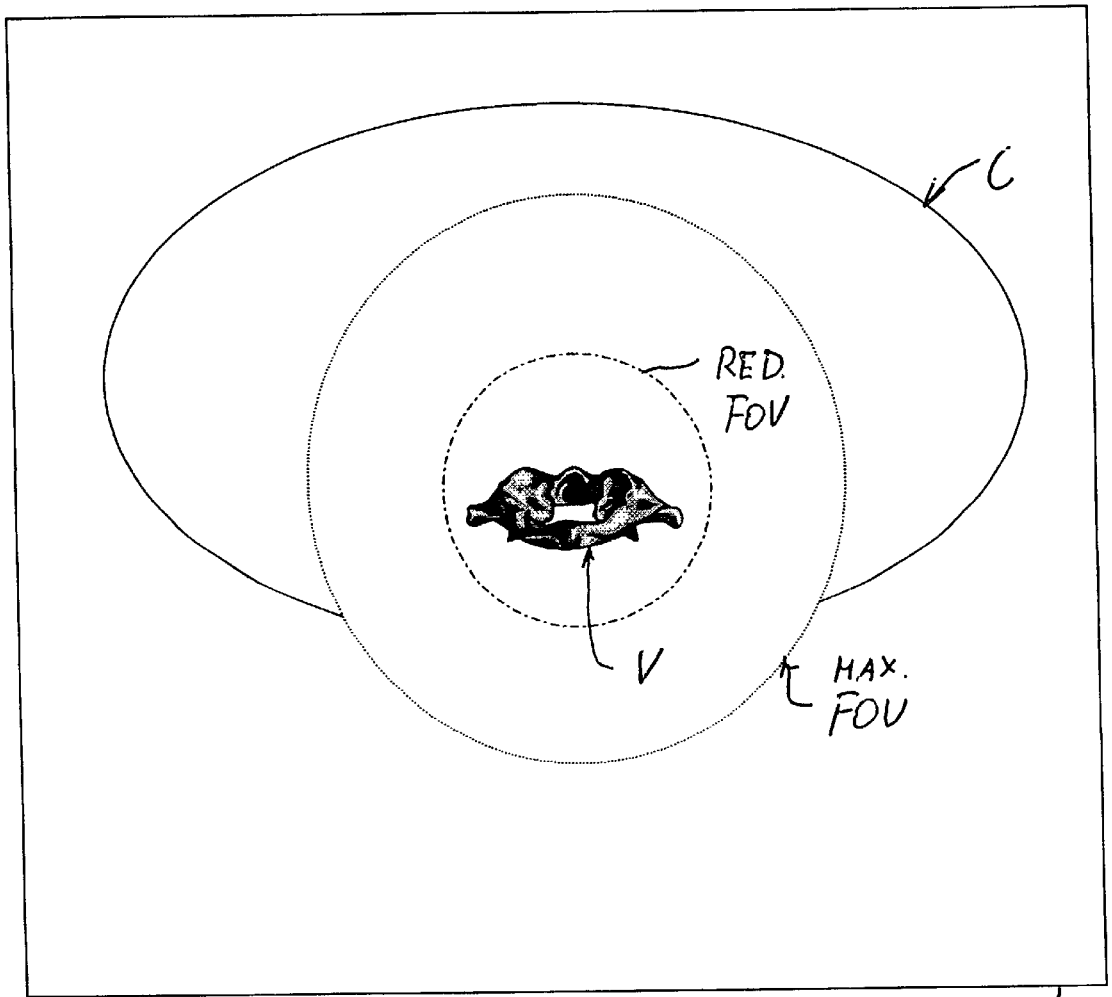

While the body under examination is displaced, the provision of means for controlling the variation of the Field of View size and/or of the sequences and/or of the parameters thereof, as well as of the modes for processing the received signals, allows real time modification of the image quality and permits, obviously by stopping the relative motion between the body under examination and the apparatus, to image with a better quality a particular slice scanned with limited sequences with respect to the quality thereof. Then the previous settings may be restored which, though with a poorer quality, allow a higher receiving and processing speed to possibly resume the steps of relative displacement of the body under examination to the magnetic structure with the simultaneous or almost simultaneous display in real time or almost in real time of the corresponding MRI image. These features are shown in a very schematic manner in FIGS. 15 and 16 and with reference to imaging of the vertebral column V of a patient. In this case, slices S1, S2, S3, S4 of the vertebral column are selected and the Field of View is reduced to about 5 cm with respect to the largest possible one, i.e. to the order of a vertebra or of a substantial portion thereof. FIGS. 15 and 16 also show graphically that the Field of View FOV may change from slice to slice. In fact the slices S1 and S4 have the same Field of View FOV1, whereas the two slices S2 and S3 have different Fields of View FOV2 and FOV3 respectively. To show this, the slices are shown by double lines and the FOV is indicated by transverse connection elements between the two double lines. Imaging is performed by setting scanning sequences which limit the definition of images, but allow to have total times from the excitation of resonance signals to the display of the corresponding image of the order of a fraction of a second, e.g. of about 0.3 seconds. By this arrangement, an image repetition may be obtained at a frame rate of three frames per second, a value which allows to display the new slice image corresponding to a new relative position between patient and apparatus or magnetic structure almost in real time or with considerably smaller delays with respect to the new relative positioning. As shown in the image, not only may the new position relate to a new slice of the body under examination, but it is also possible to scan partial images of different regions of the body under examination, all being coincident in the same slice plane. This allows to find the best shot of the vertebra coinciding with the selected slice. Thanks to a relative displacement in the axial or longitudinal direction of the vertebral column, all or some of the vertebrae of interest may be displayed successively and in real time. The displacement in three different spatial directions also allows to follow any curve of the vertebral column as lateral deviations in any radial direction whatsoever with respect to the axis thereof.

The proper positioning between the reduced Field of View and the vertebral column may be also obtained thanks to optical pointing means such as a light beam which visually marks a point coinciding with the preset slice plane.

Real time display also allows accurate positioning for instance on a vertebra to be displayed, thanks to the fact that the advance steps might be related to the axial extensions of the vertebrae. So, for example, real time display allows positioning on the next vertebrae, one after the other, to display and count them and to find the vertebra of interest. In this case, it is possible to identify univocally and visually the first vertebra wherefrom the count is to begin, thanks to the morphological properties thereof.

The method of the invention is relatively simple, as shown in the block diagram of FIG. 2.

The magnetic structure, together with the means for generating the static field, the gradient coils, the transmitting coil and the receiving coil is indicated by the block 1. The numeral 10 denotes the means for resonance signal processing, wherefrom the signals related to the acquired images are extracted and for reconstructing said images. The block 11 identifies the means for detecting the position and/or the magnitude and the space direction of the displacement vector.

The blocks 12, 12', 12" show the memories for relating the data about the relative position of the body or of the part thereof and of the imaging volume V or the magnetic structure 1, to the associated data of the image to be displayed.

The processing unit 13 is programmed in such a manner as to be able to perform the above combination and processing steps.

The means for separate and alternative or combined adjustment, particularly of the Field of View size and/or of image definition and/or image contrast and/or signal-to-noise ratio, are the control units 46 and 47, which comprise continuous selectors 147, 247, 347 or step-operated selectors 146, 246, 346 whereby the parameters relating to the type of scanning sequences and/or of image processing procedures or to the combination of scanning sequences and/or of image processing procedures are adjusted, with reference to the effect on Field of View size, definition, contrast and signal-to-noise ratio. FIG. 2 shows both types of control unit 46 and 47. The apparatus may as well have one of the two types of controls only.

The continuous unit 46, for instance, is provided in combination with memories 40, 41, 42, in which several different scanning sequences and/or image processing and/or filtering procedures are loaded with a continuous and progressive effect on the characteristics of definition, contrast and signal-to-noise ratio. The handles 146, 246, 346 adjust continuous parameters of scanning sequences and or of image processing procedures or image filtering procedures, such as repetition times, summation, mean generations, etc.

Alternatively thereto or in combination therewith, and depending on specific needs, there my be provided a control unit 47, which has step-operated adjustment selectors 147, 247, 347 in which the individual steps of the selectors are related to the execution of acquisition sequences, of image processing procedures and/or image filtering procedures, related to predetermined levels of definition, contrast and signal-to-noise ratio.

In this case, the control unit 47 and the individual selectors 147, 247, 347 are associated, by the processing unit 13, to different specific memories 42, 43, 44 containing different predetermined combinations of detection sequences, image processing procedures and/or image filtering procedures, each being preset at the factory or by the user to provide predetermined levels of Field of View size, definition, contrast and signal-to-noise ratio. These different combinations are individually loaded in the processing unit 13 or the latter is notified of the use of one of these different combinations, depending on the desired level of definition, contrast and signal-to-noise ratio by adjustment of the corresponding position of the selector 147, 247, 347 associated to one of said image quality characteristics.

Alternatively thereto or in combination therewith, several different predetermined basic scanning sequences and/or processing procedures may be stored in the memories 43, 44, 45, and their combination provides different levels of definition and/or contrast and/or signal-to-noise ratio, the selectors 147, 247, 347 being designed to generate combinations of different basic scanning sequences and/or processing procedures corresponding to the different Field of View sizes, and to the different levels of definition, contrast and signal-to-noise ratio.

In the embodiment illustrated herein there are provided the controls for the three definition, contrast and signal-to-noise ratio characteristics. Nevertheless, there may be as well provided an adjustment control for one of these characteristics only, while limiting or omitting the adjustment controls for the other characteristics, which are fixedly preset in the apparatus.

Obviously, controls or adjustments may be also added for settings of image quality adjustment variables, in addition to those expressly mentioned above.

An example of application of the above method is as follows:

Assuming that: NECC is defined as the number of acquisitions needed to calculate the mean values for noise reduction;

TR is the repetition time;

TE is the echo time;

GE is the echo gradient;

FOV is the field of view;

Fast imaging aimed at finding the most suitable relative position of the body under examination and of the imaging volume to produce the shot of the region of interest or relevance of the body C for diagnostic purposes might be performed with the following parameters:

GE TR=20 ms

TE=8 ms slice thickness 7 cm

FOV=60 mm×60 mm, Matrix size 32×16

NECC=1

Acquisition time 0.32 seconds.

d 3 frames per second

Once the right shot has been detected, resolution might be improved by a sequence of the following type:

GE TR=20 ms

TE=8 ms slice thickness 4 mm

FOV 60 mm×60 mm, Matrix size 128×64

NECC=3

In order to improve the signal-to-noise ratio, a higher NECC or longer TR might be provided, e.g.:

GE TR=100 ms

TE=10 ms slice thickness 4 mm

FOV 60 mm×60 mm, Matrix size 128×64

NECC=4

In order to increase contrasts, it is possible to adjust sequence parameters, e.g. the so-called <<flip angle>>, or even to change the sequence, for instance from GE into a T2 weighted FSE, still in short times, due to the small FOV. For example:

TR=2000 ms

TE~100 ms

FOV 60 mm×60 mm, Matrix size 128×64

With 16 echo encoding steps.

NECC=1 thereby obtaining acquisition times of 32 seconds.

In accordance with an additional method, which might be provided either separately from or in combination with the above, the processing unit 13 may be programmed or arranged in such a manner that it can combine the data set of the individual partial images, univocally related to the corresponding relative position of the body C or the part thereof and of the imaging volume V or the corresponding shot to reconstruct on displaying or printing means, e.g. on the displaying monitor 14, an image of a wider portion, i.e. a panoramic view including the region of interest, and generally denoted by P, and resulting from the combination of the individual images I, I', I", I''', of the different regions of the body or of the part thereof, as denoted in FIG. 1 by V, V', V", V'''. In this case, different image portions have to be disposed side by side in the same slice plane of the body under examination.

The combination of these images may be obtained by using any currently available graphic and video processing algorithm.

Advantageously, the displacement may be such that the regions of the body corresponding to the different images, particularly showing regions of the body under examination included in the same slice plane, overlap to a predetermined extent at their common edges, or the individual imaging regions may be spaced to a predetermined extent. In the first case, an analysis of image data during processing operations, allows to recognize the data of the different images as being present in two or more of these images, by interpolation or approximation, to ensure a fluent passage between the images I, I', I", I'''. In the second of the two cases mentioned above, interpolation or approximation may be performed by analyzing the peripheral portions of the image, i.e. the data thereof, and by reconstructing the portion connecting the different images I, I', I", I''', based on the actually detected data and in a plausible manner, so as to ensure a fluent connection therebetween.

When images are sectional images of the body or of a part thereof, then well-known algorithms may be used to generate three-dimensional digital images from several adjacent sectional images.

In all the above cases, the distance between the regions of the body under examination corresponding to an image I and to the succeeding image I', may be kept constant all through the sequence of images I, I', I", I''', or the displacing distance may vary in accordance with predetermined rules. An advantageous rule might consist in providing shorter distances between images in the immediate vicinity of the region of the highest interest, and in gradually increasing these distances as images relate to regions of the body progressively distant from said portion of interest. In this case, the information obtained in the region of interest and in the vicinity thereof is more detailed and the image data obtained from the individual images I, I', I", I''' might be possibly used to improve the quality or correct the image of the portion of the body of the highest interest. This may be easily done when the regions of the body corresponding to the individual images are defined so that they overlap at least partially as specified above. In this case, for the overlapping portions two or more unrelated images would be obtained whose combination may be used to improve contrast or to reduce noise effect.

In the embodiment of FIG. 1, the panoramic image P is shown as composed of four partial images I, I', I", I''' only on the same slice plane, and the means for relating the data thereof with the associated relative positions of the body under examination C and of the imaging volume V are shown as three in number. However, this is only due to the need of simplifying the example for a better understanding of the principle and it is to be considered without limitation. In fact, within the range of what is allowed by the magnetic structure and by possible time restrictions in the use of the apparatus, a greater number of partial images I relating to different regions of the body under examination or of a part thereof may detected and combined, as is shown more clearly in FIGS. 15 and 16.

The method of the invention may be applied to any type of Nuclear Magnetic Resonance imaging apparatus. In the so-called "total body" apparatuses, i.e. those whose magnetic structure is designed to accommodate the whole body of the patient or most of it and to generate comparatively large imaging volumes, the method of the invention provides very wide images of whole anatomic parts or limbs or important portions thereof. Moreover, zoom techniques are provided in these apparatuses, which allow imaging of limited portions of the imaging volume. In this case, the combination with the method of the invention may help to generate images whose extension is restricted to limited portions as compared with those of the whole imaging volume. Also, as specified above, the combination with the method of the invention may help to improve the image and to construct a three-dimensional image during processing operations.

The above method appears to be even more useful in combination with the so-called dedicated apparatuses, i.e. those designed for imaging specific body or anatomic parts and among the latter with ultra-compact apparatuses which, due to a drastic size and weight limitation of the magnetic structure, have very little imaging volumes. While these apparatuses have the advantage of a relatively low cost and of a high convenience, versatility and ease of use and installation, particularly when compared with larger apparatuses, the drastic limitation of the imaging volume restricts their use, particularly in terms of the possibility to obtain panoramic images even of a limited region of a limb or of an anatomic part under examination.

In this case, the method of the invention provides the possibility to extend the functionality of this type of apparatus bringing it closer to the one of larger and more expensive apparatuses and providing higher advantages in terms of cost-to-performance ratio.

The combination of the two variants of the method allows, after a relatively fast research, to take a shot of the region of interest, to perform quality imaging on this region and to insert this partial shot of the desired portion in a panoramic image in which the other partial images forming it may be detected while image quality is reduced in the regions of non immediate interest. This provides a better quality where this is required and at the same time, a fast acquisition of a general panoramic image of a wider region of the body containing the high quality shot of immediate interest.

Image quality may be also easily reduced with respect to a few adjustable parameters, such as definition, contrast and/or signal-to-noise ratio, as the distance of the partial image designed to form, in combination with the others, the comprehensive panoramic image, from the partial image or shot of interest increases.

As regards the construction of the apparatus, the latter may be made in different manners, particularly depending on the type of apparatus to be obtained. In fact, in "total body" apparatuses, or similar, the size of the cavity and of the magnetic structure are such as to allow for simpler arrangements, especially as regards the relative displacement of the body under examination with respect to the imaging volume, or to the magnetic structure.

In dedicated apparatuses, the structure and the cavity are restricted in size and different arrangements are required to make displacement means. So, while in "total body" apparatuses, or the like, the most convenient arrangement might be displacing the patient inside the cavity, by using guides of a body-supporting table or seat, in dedicated apparatuses, either the displacement of the magnetic structure with respect to the body under examination or the displacement of the body under examination with respect to the magnetic structure may be provided, or even both arrangements in combination. The latter arrangement may be advantageous in that it provides a better operational versatility, allowing to select either option depending on the limb or anatomic part to be examined.

FIG. 3 is a schematic view of a magnetic structure having the shape of an annular parallelepiped or anyway a squared shape 1, which is supported on typical slides 6, 7, 8 slidably mounted on perpendicular guides, and each being oriented in one of the three Cartesian axes. This allows to perform movements in any spatial direction. This arrangement provides advantages for this configuration of the magnetic structure or for other similar configurations derived therefrom. However, in different magnetic structures, means for displacing the magnetic structure may be also provided even so that they may be moved along polar coordinates or other systems of coordinates. In this case, the magnetic structure may, for instance, oscillate about at least one axis and move in at least one straight radial direction with respect to said axis. This may be provided, for instance, by using two slides, which may be moved along guides having the shape of an arc or of a circular sector with their axes being perpendicular to each other and to radial supporting, for instance telescopic, arms or to radial slides. In this case, the crossing point of the two perpendicular axes of the guides having the shape of a circular sector is provided outside the magnetic structure 1 and at a predetermined distance.

An additional shortcoming or difficulty particularly arises in more compact machines, as resonance signals are received by a receiving coil 9 which typically has such a size as to be as close as possible to the body or to the part thereof under examination, said receiving coil 9 being secured inside the magnetic structure.

Figure 8:
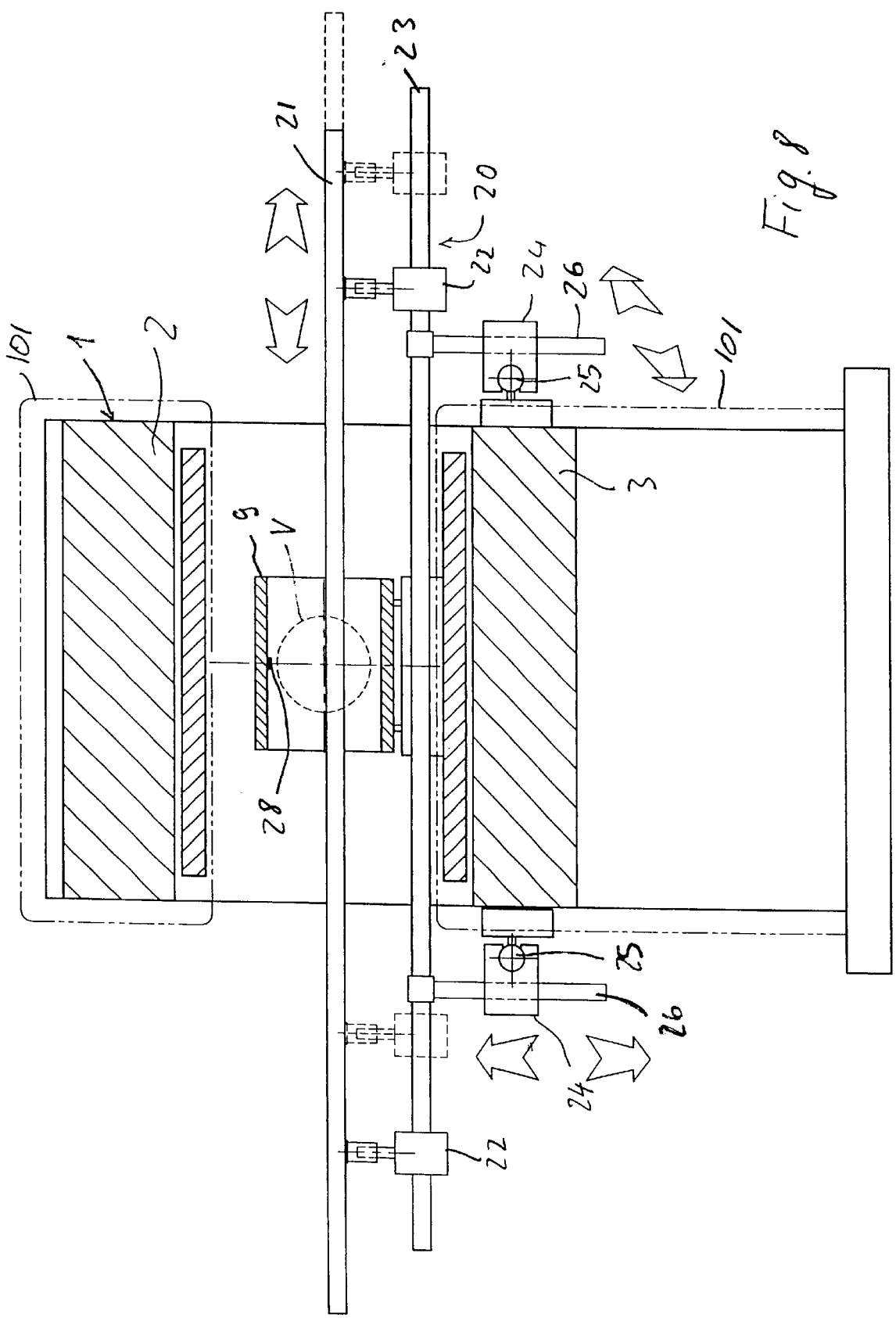
FIG. 8 is a schematic view of a magnetic structure in which a magnetic structure for Nuclear Magnetic Resonance imaging bears a receiving coil of the type as shown in the previous figures, there being provided means for supporting the body and/or the part thereof, which may be displaced along the axes of displacement of the magnetic structure, which means are associated to the receiving coil and/or to the magnetic structure.
Figure 9:
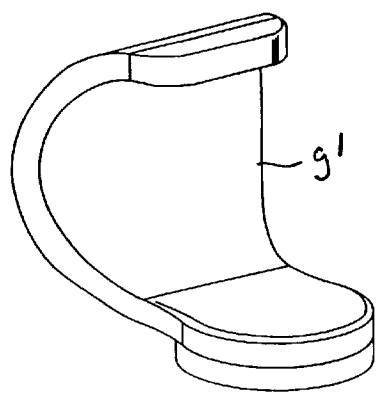
FIGS. 9 to 12 show a receiving coil of the open type.
Figure 10:
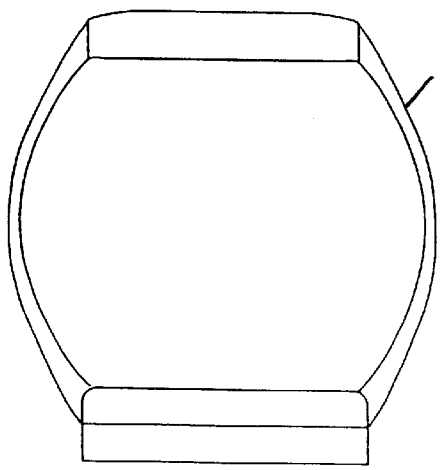
Figure 11:
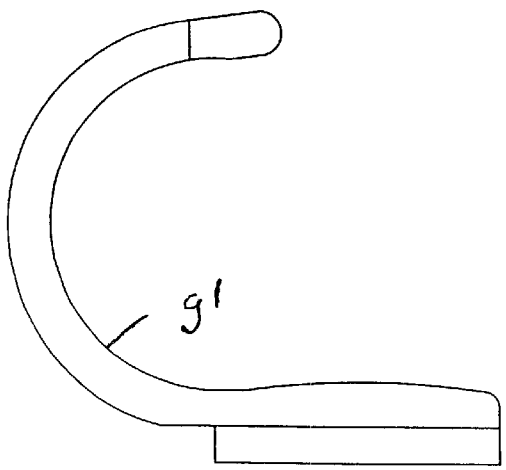
Figure 12:
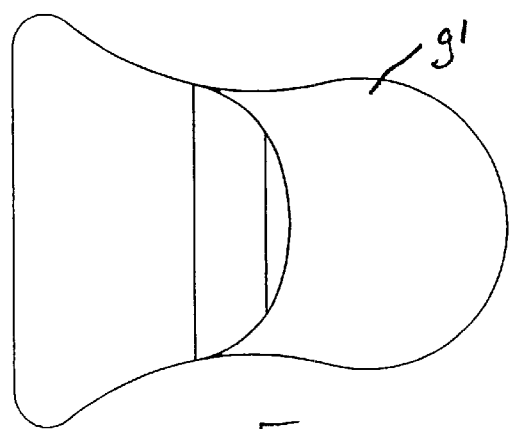

A first embodiment of the receiving coil is shown in FIGS. 4 to 7. These figures show an annular coil in which a limb, such as a hand, a foot, an arm, a leg, or the like, is inserted. Upon relative displacement of the body under examination and of the magnetic structure, together with the receiving coil 9, said receiving coil is to be displaced integrally with the magnetic structure 1. In this case the body under examination, the part thereof, the limb or the like is to be held in position so as to allow displacement with no mechanical interference with the magnetic structure and especially with the receiving coil. To this end, the magnetic structure 1, and/or the receiving coil 9 are associated to a support for the body, for the part thereof, for the limb or the like, which is displaceable relative to said structure and to said receiving coil. FIG. 8 is a schematic view of an embodiment of said support means, generally denoted by the numeral 20. In this case, the means for relative displacement of the magnetic structure 1 and of the body under examination are of the type as shown in FIG. 3, i.e. operate with movements along orthogonal axes. Hence, even the movable support means are arranged to ensure displacement with respect to the magnetic structure along the same three orthogonal axes.

These support means may include a bearing member 21, such as a cradle, a surface, or the like which passes through the receiving coil 9 and slides at the outside ends of the magnetic structure on slides 22 mounted on guides 23 which are oriented parallel to the axis of the receiving coil, which is in turn parallel to a displacement axis. The guides 23 are supported on saddles 24, which are designed to slide on guides 25 orthogonal to the former ones and supported by a stationary member 101 of the apparatus, i.e. a part which cannot be moved relative to the magnetic structure 1. The guide 23 is borne by guides 26, orthogonal to the guide 23 itself and to the guide 25 and is slidably engaged in the saddles 24. Hence, the body part under examination is perfectly still, whereas the magnetic structure moves together with the receiving coil 9.

Obviously, some of the functions of the means 20, being associated to the magnetic structure 1 in the embodiment of FIG. 8, as well as some of the displacements along at least one or along all directions may be assigned to patient supporting means located outside the apparatus, such as a patient table, seat, or the like. In this case, the table or the seat are mounted, like the magnetic structure, on orthogonal guides and have a predetermined starting position with respect to the magnet structure.

In truck-mounted, i.e. movable apparatuses, it may be arranged that at least one of the guides for relative displacement is integral with the magnetic structure or with the framework of the apparatus or with the patient table, while being removably fastened to the table or to the framework of the apparatus respectively to define a well-known starting position, even though this is not required, at least theoretically.

The position and the displacements may be read in several different manners, e.g. by means of encoders for detecting the angles of rotation and the number of revolutions completed by the driving motors, as known per se. Other means and methods, as known per se, are applicable, such as the combination of means for reading the resistance between conductors associated to the guides and to their respective slides, or code reading means associated to the slides for reading codes disposed along the slides, there being provided the possibility to use either analog or digital optical means or electronic or electromechanical means.

According to an improvement, in order to allow at least a rough detection of the region of the body under examination being imaged from time to time, one or more light emitters may be mounted on the receiving coil and/or on the magnetic structure, the cone of light of the beam incident on the body surface indicating the imaging portion. These means may be of any type, i.e. a conventional light source associated to appropriately calibrated optical instruments or coherent light beams, such as laser beams having a harmless frequency or the like. FIG. 8 shows these light pointing means mounted on the receiving coil 9 and generally denoted by the reference number 28.

Figure 13:
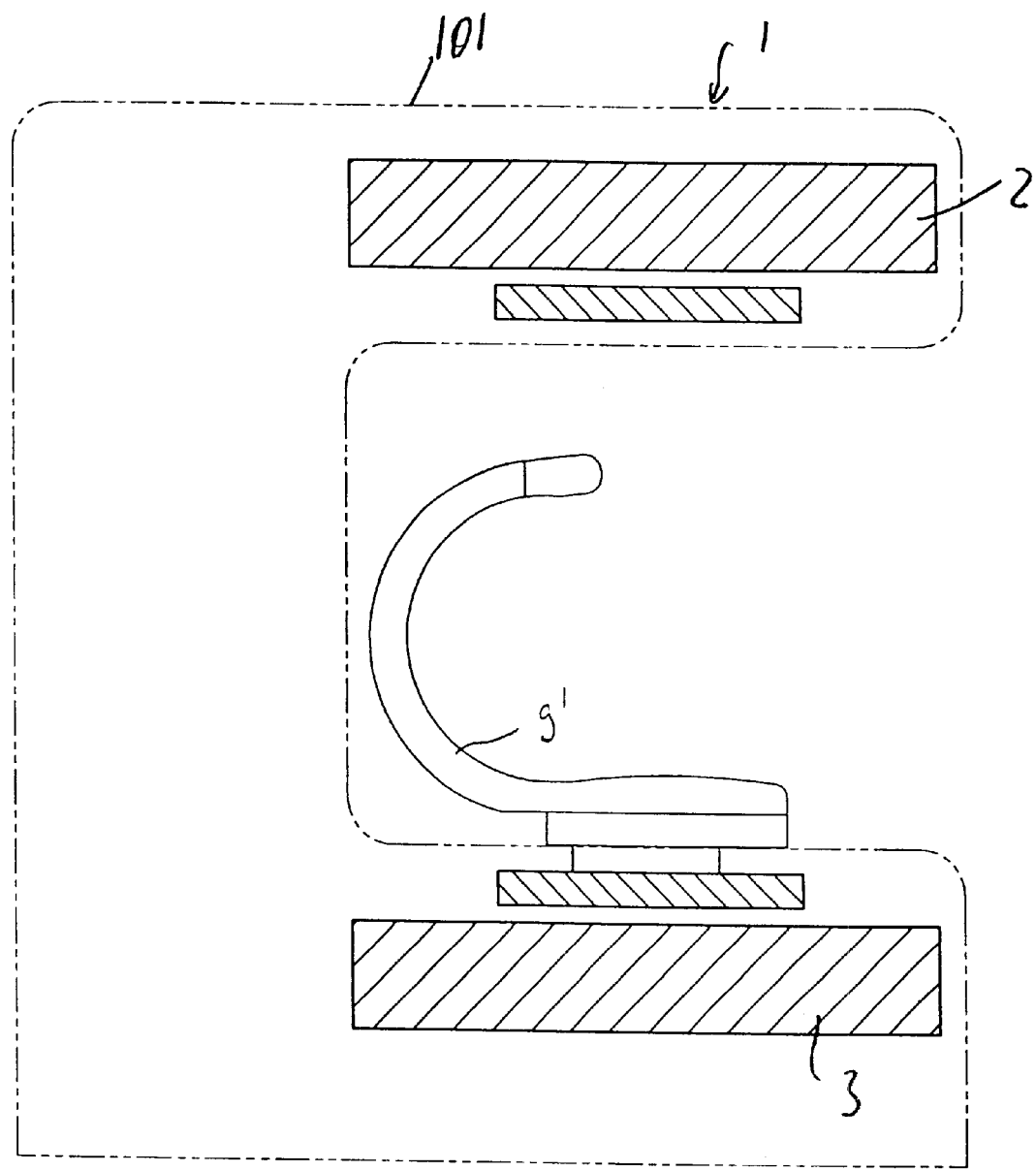
FIG. 13 is a sectional view of a magnetic structure with said coil.

FIGS. 9 to 12 show a receiving coil which is different from the one described above. It is denoted with numeral 9' and has an open shape or is shaped like a sector of a cylindrical shell or the like. This coil has reduced limitations as compared with the previous one and allows an easier relative displacement. FIG. 13 shows the coil mounted in the magnetic structure 1, whereas the movable means for supporting the body or the part thereof are still required, at least for certain body parts, even though they have been omitted for the sake of simplicity. The receiving coil 9' also allows imaging of the neck and of the head, ensuring in this case a stationary support of the head of the patient on the open side thereof, to keep it still in position during its relative motion with respect to the magnetic structure and to the receiving coil 9'. Here again the magnetic structure and/or the receiving coil 9' may have one or more light means for pointing and indicating the imaged area.

Figure 14:
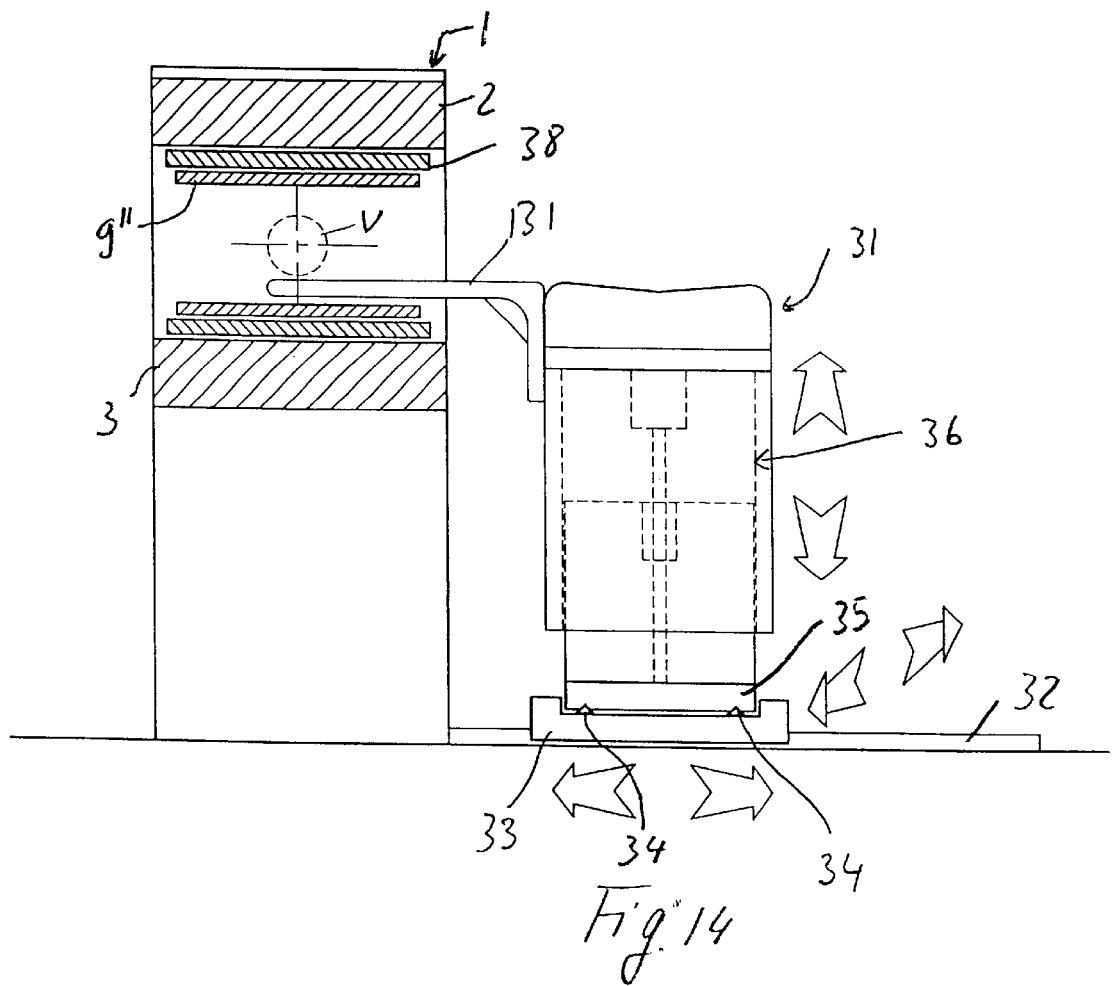
FIG. 14 shows a variant embodiment, in which the means for supporting the body or the portion thereof to be examined are supported by means disconnected from the magnetic structure and/or from the receiving coil, the latter being integrated in the magnetic structure of the Nuclear Magnetic Resonance imaging apparatus, while said magnetic structure is stationary and the means for supporting the body or the portion thereof are movable in a predetermined and measurable manner relative thereto.

FIG. 14 shows a variant of the apparatus according to the invention, in which the magnetic structure 1 is stationary, while the patient supporting means, in this case shown without limitation as a patient table 31 with a overhanging bracket for supporting a limb, e.g. an arm, may be moved along three orthogonal axes which have a predetermined position with respect to one or more axes of the magnetic structure 1 or to one or more axes of the imaging volume V. The patient table 31 may be displaced along a guide 32 towards and away from the magnetic structure 1 on a first slide 33. Particularly, the guide or rail 32 is oriented parallel to the direction in which the body under examination or the part thereof is introduced in the imaging cavity The slide 33 has a second transverse guide 34 along which the patient table 31 may be displaced by means of a saddle 35, and the patient table 31 may be lifted and lowered vertically along a guide 36. Here again the driving means, the guides and the slides, as well as the position detecting means may have any construction, adapted from time to time to the morphology of the magnetic structure 1, of the body or of the parts thereof to be examined.

In accordance with an additional advantageous characteristic, also shown in FIG. 14, but not being limited to this embodiment, the receiving coil 9" is integrated, in this case, in the magnetic structure of the apparatus. This may be arranged with no excessive loss of the receiving signal power, particularly in dedicated or ultra compact apparatuses. In fact, as shown in FIG. 14, the receiving coil extends on at least some delimiting walls of the imaging cavity of the magnetic structure 1 depending on the construction and on the shape of the coil. In said type of apparatuses, the cavity has a limited size, whereby the receiving coil is not too so far from the body under examination as to affect or attenuate the received signals. As FIG. 14 shows, the receiving coil 9" is immediately adjacent to the inner side of the transmitting coil 38, which extends along the poles 2, 3 and/or other delimiting walls of the imaging cavity. Hence, the receiving coil 9" is enclosed inside the covering and finishing case of the magnetic structure, as shown in dashed lines in FIGS. 8 and 13 and denoted by the numeral 101.

The invention is not limited to the embodiments illustrated and described herein, but may be greatly varied especially as regards construction. Particularly, the characteristics illustrated and described above with reference to the different schematic embodiments may be provided in any combination or sub-combination. All the above without departure from the guiding principle disclosed above and claimed below.

Thus according to a further embodiment which may be provided separately or in combination with the other features describe above, the invention allows to drastically limit the volume of the cavity for housing the part of the body under examination and in which the static magnetic field has the characteristics of homogeneity which are sufficient to obtain useful images. Limiting such volume which is permeated by the static magnetic field having the requested characteristics of homogeneity to extensions of the order of some centimeters, for example of a sphere or a cube having a diameter or having sides of some centimeters, for example from 3 to 10 cm, particularly from 4 to 6 cm, especially of about 5 cm, it is possible to avoid the need of providing dephasing sequences which are needed for limiting the field of view (FOV). At the same time it is possible to significantly limit the overall size of the magentic structure and the costs thereof.

What is claimed is:

1. A method of Nuclear Magnetic Resonance imaging, which method comprises:
   a) generating a static magnetic field in an imaging volume;
   b) introducing a part of a body in said imaging volume for examination in a first imaging position;
   c) generating magnetic field gradients in several different spatial directions to select a scan slice of the body under examination and to phase-encode nuclear spins in the selected slice;
   d) generating sequences of electromagnetic signals to excite the nuclear spins of the body part introduced in the imaging volume;
   e) receiving resonance signals emitted by the nuclear spins and processing the received resonance signals to extract information therefrom and to reconstruct corresponding images which relate only to a predetermined limited region of the body part to be examined;
   f) displacing the body part to be examined a predetermined extent from said first imaging position to a second imaging position, parameters associated with said displacement being stored;
   g) repeating said steps c) through f) for further regions of the body part under examination corresponding to further relative positions between the body and the imaging volume, by displacing the body part in predetermined directions relative to the imaging volume; and
   h) limiting the useful imaging volume permeated by the magnetic field to ensure proper Nuclear Magnetic Resonance imaging, in all spatial directions with reference to the predetermined limited region of the body part under examination, the body part under examination being displaced relative to said imaging volume in the three spatial directions.

2. A method as claimed in claim 1, wherein the corresponding images of the predetermined limited regions of the body part under examination are obtained with scanning sequences providing low definition images or fast sequences.

3. A method as claimed in claim 1, wherein the method provides a reduction of useful volume of data to be processed for image display and/or the modification of the characteristics of the scanning sequences which determine the signal-to-noise ratio and/or contrast in such a manner as to limit detection and/or processing and/or display times for each image to such an extent as to obtain total detection, processing and display times for the scanned image below one second.

4. A method as claimed in claim 1, wherein the useful volume is set as having a size corresponding to a detail of interest of the body part under examination.

5. A method as claimed in claim 1, wherein, once a shot of a region of interest of the body part has been defined, an acquisition scan is performed thereon with sequences intended to provide a higher definition and/or a higher contrast and/or a better signal-to-noise ratio.

6. A method as claimed in claim 5, wherein the parameters relating to a higher definition and/or to a higher contrast and/or to a better signal-to-noise ratio are adjusted by means of controls incorporated in the Nuclear Magnetic Resonance imaging apparatus.

7. A method as claimed in claim 1, wherein settings for acquisition sequences and/or for processing and displaying procedures and/or for definition are such that they provide, for movable scanning of the body part under examination, frame rates of 10 to 1 frames per second.

8. A method as claimed in claim 1, wherein a Field of View is typically set to a size corresponding to a sphere or in section to a circle whose diameter is of 10 to 3 cm.

9. A method as claimed in claim 8, wherein the diameter is about 5 or 6 centimeters.

10. A method as claimed in claim 1, wherein the method provides that a predetermined total imaging time is set, from echo excitation to image display and combined adjustment, in real time through controls pre-integrated in an imaging apparatus, of parameters relating to a size of Field of View and/or to definition and/or to contrast and/or to signal-to-noise ratio.

11. A method as claimed in claim 1, wherein the method provides that an image is newly acquired, after stopping displacement of the body part under examination, with parameters relating to a different size of the Field of View and to a higher definition and/or to a better contrast and/or to a better signal-to-noise ratio, providing a better image quality and that, after said new image is acquired with a better image quality, the settings are restored to a poorer image quality with respect to one or more of said parameters and at real time display conditions of the different image portions obtained by displacing the body under examination.

12. A method as claimed in claim 1, further comprising visually showing the slice portion of the image to be scanned of the body part under examination by pointing means and from outside the body part under examination.

13. A method as claimed in claim 1, wherein the method includes the univocal definition of the relative position between the body part and the imaging volume.

14. A method as claimed in claim 13, wherein the method includes a univocally related storage of the individual images and of the parameters of relative positioning of said image with respect to the other images.

15. A method as claimed in claim 1, wherein the method provides editing of scanning sequences and of modes for signal processing and/or transformation into images and filtering of said images separately with reference to the characteristics of the image which are to be adjusted, separately with reference to definition, contrast and signal-to-noise ratio.

16. A method as claimed in claim 15, wherein the method provides a separate control for the characteristics of the acquisition sequences and/or of the processing modes and/or of image filters with reference to the effect on images particularly as regards Field of View size and/or definition and/or contrast and/or signal-to-noise ratio.

17. A method as claimed in claim 16, wherein the control for adjusting image quality in terms of Field of View size and/or definition and/or contrast and/or signal-to-noise ratio may operate in a continuous or step-like manner, as determined by the continuous or discrete variability of the parameters of sequences and of processing software or by their consisting of additional sequence or processing steps or of a combination of sequences or processing procedures or of repeated sequences or processing procedures.

18. A method as claimed in claim 1, wherein there may be provided a certain number of stored basic scanning sequences and/or image processing procedures, which may be combined with each other, the control for adjusting Field of View size and/or image definition and/or contrast and/or signal-to-noise ratio characteristics consisting of controls of combination of said sequences and/or of said processing procedures.

19. A method as claimed in claim 18, wherein each combination provided is associated to an indication for the user, which does not define the combination of sequences or processing procedures, but the related level of Field of View size and/or definition and/or contrast and/or signal-to-noise ratio.

20. A method as claimed in claim 19, wherein low definition, low contrast and low signal-to-noise ratio panoramic images are obtained, hence low or medium quality panoramic images.

21. A method as claimed in claim 19, wherein high quality panoramic images may be obtained, independently and/or in combination in terms of definition, contrast and signal-to-noise ratio, the user being allowed the possibility to edit the characteristics of acquisition sequences and/or the image processing and/or filtering modes in such a manner as to adjust, separately or in combination, definition and/or contrast and/or signal-to-noise ratio.

22. A method as claimed in claim 19, wherein hybrid panoramic images may be obtained composed of partial shots, each having at least partly different Fields of View and/or an inconsistent image quality, particularly in terms of definition and/or contrast and/or signal-to-noise ratio.

23. A method as claimed in claim 1, wherein the method provides predetermined combinations of basic sequences or basic procedures, which are related to a change of Field of View size and/or definition and/or contrast and/or signal-to-noise ratio, the corresponding adjustment controls simply consisting of selectors of predetermined and preset combinations.

24. A method as claimed in claim 1, wherein the different images displaying shots of partial regions of the body part being examined, in relation to their relative position of the body part and of the imaging volume, may be combined together to form a panoramic image composed of the individual partial images of the body part.

25. A method as claimed in claim 1, wherein said displacement may account for the size of the predetermined limited region whereof imaging is performed, so as to obtain images of limited regions whose boundaries are substantially coincident, slightly overlapping or slightly spaced from each other.

26. A method as claimed in claim 1, wherein image data are examined for recognition of the portions shared by several images, this information being used to correct the panoramic image (P) by an approximation algorithm so that a proper passage from one image to the other can be obtained.

27. A method as claimed in claim 1, wherein when images partly overlap, it provides recognition of repeated image portions and approximation of an optimized image for the two adjacent images in the junction area.

28. A method as claimed in claim 1, wherein from slightly spaced images, the passage area is reconstructed on the basis of the data of the two adjacent images so that the passage between one image and the other can be optimized.

29. A method as claimed in claim 1, wherein, for each limited image portion, or for each group thereof, different Fields of View are provided in accordance with specific rules of the anatomic part whereto it relates.

30. A method as claimed in claim 1, wherein when creating panoramic images in which the object of interest is a part of the panoramic image composed of individual images of adjacent or contiguous limited regions, the peripheral portions may be imaged with reference to predetermined limited regions whose Fields of View are larger than the predetermined limited regions related to the detail of interest.

31. A method as claimed in claim 30, wherein, in order to generate three-dimensional images, it provides the use of methods and algorithms for generating/reconstructing digital three-dimensional images.

32. A method as claimed in claim 1, wherein Nuclear Magnetic Resonance images related to the individual limited portions are sectional images of the body or of the part thereof, the panoramic image being a three-dimensional image.

33. A method as claimed in claim 1, wherein the displacement between the body under examination and the imaging volume may be performed in steps of equal width or increasing or progressing according to a predetermined rule, said displacement steps being for instance smaller in the region of highest interest of the part under examination and larger in the region of lowest interest.

34. An apparatus as claimed in claim 33, wherein the processing means include means for recognition of overlapping areas of the individual images of the limited partial regions and for combination thereof into the overall image so that said overlapping areas can be properly positioned.

35. A method as claimed in claim 1, wherein step c) includes univocally phase encoding nuclear spins in the selected slice.

36. A method as claimed in claim 1, wherein the frame rates are about 3 frames per second.

37. An apparatus for Nuclear Magnetic Resonance imaging, which apparatus comprises:
  a) a magnetic structure for generating a static field in a predetermined volume inside an imaging cavity and with at least one opening to provide access to said imaging cavity;
  b) at least one transmitting coil and at least one receiving coil;
  c) at least one gradient coil;
  d) a processor for processing resonance signals to transform the resonance signals into displayable image signals;
  e) a display for displaying image signals;
  f) a displacer for relative displacement of the body under examination and of the magnetic structure;
  g) a control device for adjustment of Field of View size.

38. An apparatus as claimed in claim 37, wherein the control device includes continuous or step-operated selectors whereby parameters relating to a type of scanning sequences and/or of image processing procedures or to a combination of scanning sequences and/or of image processing procedures are adjusted, with reference to an effect on Field of View size and/or definition and/or contrast and/or signal-to-noise ratio.

39. An apparatus as claimed in claim 37, wherein there are provided memories for storage of several different basic scanning sequences and/or processing procedures or combinations thereof or several different predetermined scanning sequences and/or processing procedures and relating to different definition and/or contrast and/or signal-to-noise ratio qualities and/or to different Field of View sizes, the controls being arranged to adjust the parameters for execution of the different basic scanning sequences or processing procedures and/or to generate combinations of different scanning sequences and/or different basic processing procedures and/or to select combinations of scanning sequences and/or different processing procedures or particular scanning sequences or processing procedures, which are prefixed and associated to the different desired Field of View size and/or definition and/or contrast and/or signal-to-noise ratio variations and a processing unit connected to said controls and to said memories.

40. An apparatus as claimed in clam 37, further comprising:
   h) means for measuring displacement direction/s and distances;
   i) means for relating resonance signals to the relevant parameters of relative positioning of the body under examination and of the magnetic structure;
   j) means for storing the different images and their respective position parameters;
   k) processing means for combining images.

41. An apparatus as claimed in claim 37, wherein the processing means include means for reconstruction of intermediate non imaged areas between the individual images of the limited partial regions on the basis of the data of acquired images.

42. An apparatus as claimed in claim 37, wherein the means for acquiring and processing the portions shared between the individual images and/or the means for reconstructing non imaged areas interposed between the individual images are algorithms loaded on a processing unit.

43. An apparatus as claimed in claim 37, wherein the means for relative displacement of the body and of the magnetic structure are provided in combination with analog or digital, mechanical, electromechanical, electronic or optoelectronic means for detecting the relative position of the body under examination and of the magnetic structure or the imaging volume.

44. An apparatus as claimed in claim 37, wherein the means for relative displacement of the body and of the magnetic structure are fully associated to the magnetic structure or to the means for supporting the patient or the body under examination, or both to the magnetic structure and to said means for supporting the body under examination, or partly to the magnetic structure and partly to the means for supporting the body under examination.

45. An apparatus as claimed in claim 37, wherein the means for relative displacement of the body and of the magnetic structure are arranged to allow displacement along cartesian coordinates consisting of combinations of guides and slides mounted one upon the other and being able to slide along three axes perpendicular to each other along polar coordinates, to consist of combinations of slides and arched and straight guides or oscillating members and straight guides, particularly depending on the geometry of the magnetic structure, of the imaging volume and/or of the body to be examined.

46. An apparatus as claimed in claim 37, wherein, in combination with the magnetic structure and with the means for relative displacement of the body and of the magnetic structure there are provided movable means of the body under examination or of a part thereof which are movable relative to the magnetic structure and are supported by stationary members.

47. An apparatus as claimed in claim 46, wherein said movable support means are associated to the receiving coils.

48. An apparatus as claimed in claim 47, wherein the receiving coils are annular or tubular, the movable displacement means consisting of surfaces, supports, or cradles which pass through said receiving coils and are supported by combinations of slides and guides which ensure displacements corresponding to the relative displacements of the magnetic structure with respect to the body under examination.

49. An apparatus as claimed in claim 37, wherein the receiving coils are arranged to be open and shaped as a sector of a cylinder or ring, said movable support means being provided at the opening area of said receiving coils.

50. An apparatus as claimed in claim 37, wherein the receiving coils are fixedly integrated in the magnetic structure particularly in one or more delimiting walls of the imaging cavity.

51. An apparatus as claimed in claim 37, wherein the movable means for supporting the body part under examination consist of extensions of a means for supporting the body or the patient, overhanging from said means for supporting the body and having such a size as to be able to penetrate the imaging cavity of the magnetic structure.

52. An apparatus as claimed in claim 37, wherein the movable means for supporting the body part under examination are associated to the magnetic structure and/or to the receiving coil and/or partly to the magnetic structure and/or partly to the receiving coil.

53. An apparatus as claimed in claim 37, wherein the control device includes means for adjusting image definition, image contrast, or signal-to-noise ratio.

54. An apparatus as claimed in claim 37, wherein the means for separate and alternative or combined adjustment of the Field of View size and/or of image definition and/or image contrast and/or signal-to-noise ratio, are continuous or step-operated selectors whereby the parameters relating to the type of scanning sequences and/or of image processing procedures or to the combination of scanning sequences and/or of image processing procedures are adjusted, with reference to the effect on Field of View size and/or definition and/or contrast and/or signal-to-noise ratio and said selectors are identified by their action or effect on the displayed image with respect to the smaller or larger Field of View size and/or to the lower or higher definition and/or to the lower or higher contrast and/or to the lower or higher noise level.

55. An apparatus as claimed in claim 37, wherein a magnetic structure is provided having limited or reduced dimensions which are apt to generate a static magnetic field with sufficient homogeneity for obtaining useful images and which permeates a volume of the cavity of the magnetic structure having linear dimension such as sides or diameter of a geometric solid describing such volume from about 3 to about 10 cm for limiting the field of view of the image.

56. An apparatus as claimed in claim 55, wherein the linear dimension is about 4–6 centimeters.

57. An apparatus as claimed in claim 55, wherein the linear dimension is about 5 centimeters.

58. A method of Nuclear Magnetic Resonance imaging, which method includes the following steps:
   a) generating a static magnetic field in an imaging volume;
   b) introducing a body or a part of said body in said imaging volume for examination in a first imaging position;
   c) generating magnetic field gradients in several different spatial directions to select the scan slice of the body under examination and to phase-encode nuclear spins in the selected slice;
   d) generating sequences of electromagnetic signals to excite the nuclear spins of the body introduced in the imaging volume;
   e) receiving resonance signals emitted by the nuclear spins and processing the received resonance signals to extract information therefrom and to reconstruct a corresponding image having a field of view of a first dimension;
   f) displacing the body to be examined a predetermined extent from said first imaging position to a second imaging position, parameters associated with said displacement being stored;

g) repeating steps c through f for further regions of the body part under examination corresponding to further relative positions between the body and the imaging volume, by displacing the body or the part thereof in predetermined directions relative to the imaging volume until a desired part of the body is imaged; and h) after a region of interest is defined, performing acquisition scanning with sequences intended to reconstruct a corresponding image having a field of view of a second dimension that is larger than the first dimension.

59. An apparatus for Nuclear Magnetic Resonance imaging, which apparatus comprises:

a) a magnetic structure for generating a static field in a predetermined volume inside an imaging cavity and with at least one opening to provide access to said imaging cavity;

b) at least one transmitting coil and at least one receiving coil;

c) at least one gradient coil;

d) a processor for processing resonance signals to transform the resonance signals into displayable image signals;

e) a display for displaying image signals;

f) a displacer for relative displacement of the body under examination and of the magnetic structure;

g) means for separate or combined adjustment of size so that the apparatus can selectively operate in a first mode to define a region of interest in a body to be examined using a first level of size, and then switch to a second mode to perform acquisition scanning with a second level of size, wherein the second level of size provides a better image than the first level of size.

60. An apparatus for Nuclear Magnetic Resonance imaging, which apparatus comprises:

a) a magnetic structure for generating a static field in a predetermined volume inside an imaging cavity and with at least one opening to provide access to said imaging cavity;

b) at least one transmitting coil and at least one receiving coil;

c) at least one gradient coil;

d) a processor for processing resonance signals to transform the resonance signals into displayable image signals;

e) a display for displaying image signals;

f) a displacer for relative displacement of the body under examination and of the magnetic structure in three spatial directions;

g) means for separate or combined adjustment of size so that the apparatus can selectively operate in a first mode to define a region of interest in a body to be examined using a first level of size, and then switch to a second mode to perform acquisition scanning with a second level of size, wherein the second level of size provides a better image than the first level of size.

* * * * *